United States Patent [19]
Morgan et al.

[11] Patent Number: 5,586,145
[45] Date of Patent: Dec. 17, 1996

[54] TRANSMISSION OF ELECTRONIC INFORMATION BY PULSE POSITION MODULATION UTILIZING LOW AVERAGE POWER

[76] Inventors: Harry C. Morgan, 2720 E. Ponderosa, Apt. 76, Camarillo, Calif. 93010; William H. Boyd, 3486 West Farrell Cr., Newbury Park, Calif. 91320

[21] Appl. No.: 337,045

[22] Filed: Nov. 10, 1994

Related U.S. Application Data

[63] Continuation-in-part of Ser. No. 2,641, Jan. 11, 1993, abandoned.

[51] Int. Cl.$^6$ ..................................... H03K 7/04
[52] U.S. Cl. ..................... 375/239; 370/213; 332/112; 327/31
[58] Field of Search ..................... 375/239, 237, 375/238, 219, 257, 258, 287, 288, 296, 297, 317, 318, 319; 370/8, 9, 10; 329/311, 312, 313; 332/112, 113, 114; 326/62.68; 327/31–38

[56] References Cited

U.S. PATENT DOCUMENTS

| | | |
|---|---|---|
| 3,271,689 | 9/1966 | Hodder .................. 375/239 X |
| 3,274,497 | 9/1966 | Zimmerman .......... 375/239 X |
| 3,380,003 | 4/1968 | Bemmann ............. 375/239 X |
| 3,898,589 | 8/1975 | Tustison ................ 375/239 X |
| 4,641,317 | 2/1987 | Fullerton . |
| 4,743,906 | 5/1988 | Fullerton . |
| 4,813,057 | 3/1989 | Fullerton . |
| 4,979,186 | 12/1990 | Fullerton . |
| 5,363,108 | 11/1994 | Fullerton . |

Primary Examiner—Young T. Tse
Assistant Examiner—Bryan E. Webster
Attorney, Agent, or Firm—Gene W. Arant

[57] ABSTRACT

A method and apparatus are shown for generating and transmitting very short and widely separated high frequency sine-wave pulses of electromagnetic energy into space. A transistor, a charging capacitor, and an inductor are coupled into a first series loop path to form a discharge circuit. A bias voltage source, the same charging capacitor, and a charging resistor are coupled into a second series loop path to form a recharging circuit. The bias voltage source is selected to be capable of biasing the forward conduction path of the transistor near its breakdown condition. An original information signal is sampled upon each occurrence of a periodic reference signal, and the transistor is then triggered into its breakdown or avalanche mode. The starting times of successive transmitted pulses are modified in accordance with a pulse position modulation protocol.

57 Claims, 7 Drawing Sheets

TRANSMISSION OF ELECTRONIC INFORMATION BY PULSE POSITION MODULATION UTILIZING LOW AVERAGE POWER

RELATED APPLICATION

This application is a Continuation-in-Part of our prior application Ser. No. 08/002,641, filed Jan. 11, 1993 and now abandoned.

BACKGROUND OF THE INVENTION

As electronic communication becomes more widely used, it becomes increasingly important to be able to transmit information with low average power and with a system of modulation that is highly resistant to interference and noise.

The most common technique in present day communications is to employ modulation for superimposing one or a plurality of messages upon a high-frequency carrier, which is then transmitted through a transmission medium and demodulated at a receiving location to recover separately the intelligence contents of the various messages. The message signals in their original form may be audio, data pulses, video, or of some other character. The medium through which the high-frequency carrier passes may be the air, in the case of radio transmission; coaxial cable; optical fiber cable; or other type of medium.

Many engineering factors are important, including among others initial cost, reliability, and useful life of equipment; operating power required; fidelity of transmission; and susceptibility of the transmission to noise or interference. Another factor that enters into present day situations is the need for government approval for radio transmitting equipment. The government has set a standard for average transmitted power above which a separate government license must be obtained for each installation. It is advantageous in many situations to be able to communicate by electronic means without the need for such government approval.

It has been previously known, however, to utilize a method of communication in which only very short, very widely separated pulses of energy are transmitted. That method does hold a promise of lower susceptibility to noise or interference, and may also avoid the need for a government license. It is that type of system to which the present invention relates.

PRIOR ART

U.S. Pat. No. 3,736,509 issued to Munn on May 29, 1973 shows an avalanche device used with a capacitor to generate pulses. Using a pulse position modulation (PPM) system the transmitter and receiver are not under control of clocks. (See Cols. 1 & 2).

U.S. Pat. No. 3,806,795 issued Apr. 23, 1974 to Morey discloses a transistor Q1 used in the avalanche mode to generate pulses. (See FIG. 4 and Cols. 4 and 5).

U.S. Pat. No. 4,461,317 was issued Feb. 3, 1987 to Fullerton. It discloses a pulse position modulation (PPM) system which generates a very short pulse with a fixed frequency and a variable pulse width. The system utilizes NPN transistors operating in the avalanche mode. The system opens windows of sensitivity to receive incoming pulses. (See FIG. 4; Cols. 2, 3, 4, 5, 7, and 8).

SUMMARY OF THE INVENTION

According to the present invention, message information in electronic form is transmitted as a series of discrete, widely separated high frequency pulses. Each pulse consists essentially of a single cycle at the transmitted signal frequency, but whose time position represents the intelligence being transmitted.

An original information signal is sampled upon each occurrence of a periodic reference signal. In response to each sampling of the information signal, an output pulse is generated that is varied in time relative to the associated reference signal by an amount proportional to the then existing amplitude of the information signal. A series of output pulses thus produced then represents the information signal in a configuration known as pulse position modulation (PPM), sometimes also known as pulse time modulation (PTM). In accordance with the invention each output pulse that represents the information signal is applied to a driver that in turn produces an energy pulse of brief, essentially constant duration but whose time position corresponds to that of the output pulse that initiated it. A high-frequency transmitted signal is thus generated that consists of a series of discrete, widely separated high frequency pulses.

According to the present invention it is of particular importance that the output pulses produced in sampling the original message information are of extremely brief duration; the high-frequency signals transmitted through the transmission medium are in the form of very short pulses; and the resting time between pulses of the high-frequency transmission is at least many times the length of each transmitted pulse.

The presently preferred method of sampling the original message or information signal involves generating a sawtooth wave or positive ramp voltage under control of a periodic clock reference signal; applying the sawtooth wave to one input of a voltage comparator; applying the original message signal plus a fixed direct voltage bias to the other input of the comparator; and generating an output pulse each time that the two inputs to the comparator coincide; that is, each time that the difference between the two voltages becomes zero. The sawtooth voltage preferably has a resting period about equal to the voltage ramp time.

In accordance with the present invention the preferred method of generating a high-frequency transmitted signal involves utilizing an avalanche transistor that is biased near its breakdown voltage. When an output pulse from the voltage comparator is applied to the transistor, the avalanche transistor breaks down and conducts a very heavy current with a very rapid rise time. The energy pulse passing through the avalanche transistor is applied to a normally quiescent inductor circuit, producing an oscillation of very brief duration. The inductor circuit then remains quiescent for a time period that is very long compared to the length of the transmitted pulse.

A further preferred feature of the invention is that a charging capacitor associated with the inductor circuit is so arranged that the energy is discharged very rapidly, and the transmitted pulse may then be as brief as a single cycle of wave energy. A circuit feature prevents rapid recharging of the capacitor, so that the charge cannot be immediately replaced. It is preferred to utilize a delay line to provide the charging capacitor.

Another preferred feature of the invention is to provide a receiver circuit that is series-tuned, to be responsive to low energy signals. It is also a preferred feature to provide the receiver with a "window" operation such that the circuit will be de-energized for most of the time between transmitted pulses, thus reducing its susceptibility to interference or noise signals.

This type of PPM system therefore requires only a very low average transmitted power. The operating power required in the present system is therefore also minimized, and the susceptibility to interference signals is also reduced.

Figure 1:
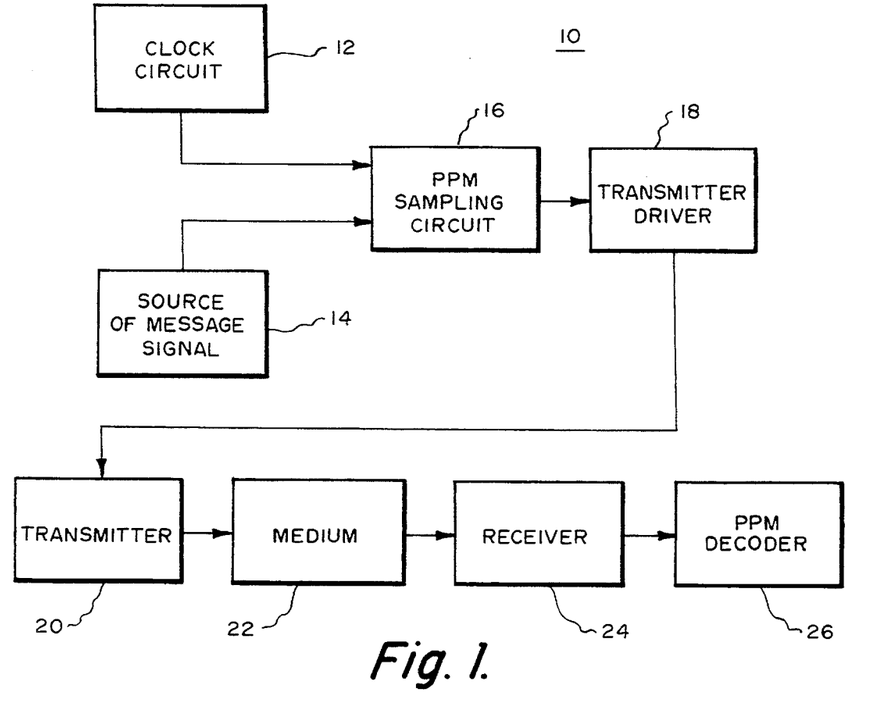
FIG. 1 is a schematic block drawing of a signal modulation, transmission, reception, and demodulation system in accordance with the present invention.

THE INFORMATION TRANSMISSION SYSTEM (FIG. 1)

Referring now in particular to FIG. 1, it shows in a block diagram form an information transmission system 10 for signal modulation, transmission, reception, and demodulation in accordance with the present invention. A clock circuit 12 provides a periodic timing signal, at a repetition rate which may for example be about 16 kilohertz or 16,000 cycles per second. A source 14 provides an original message signal which may, for example, be an audio signal such as a music signal. The outputs of the clock circuit 12 and the signal source 14 are applied to a PPM sampling circuit 16.

From the sampling circuit 16 the output pulses are supplied to a transmitter driver 18, producing pulses of very short duration which in turn energize a transmitter 20. High-frequency pulse signals, in a spaced series in accordance with the PPM scheme, are applied from the transmitter 20 to a transmission medium 22. In the case of ordinary radio transmission, cordless phones, cellular phones, or the like, the transmission medium is air. A receiver 24 receives the transmitted information and applies it to a PPM decoder 26 where the original message information is recovered.

Figure 2A:
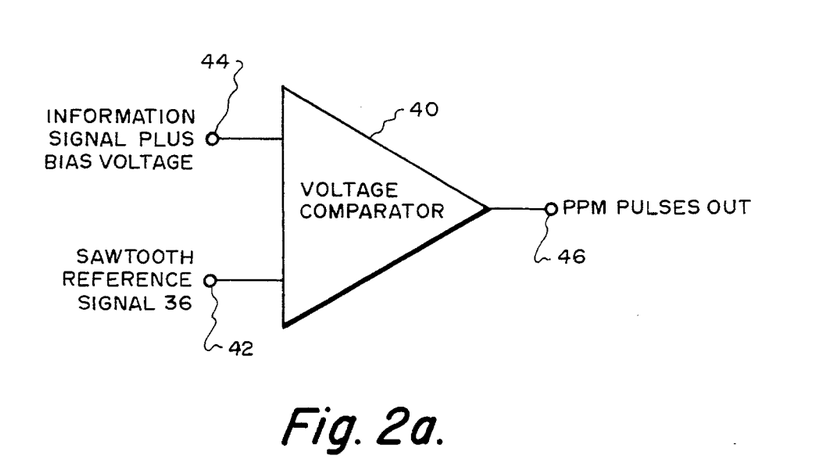
FIG. 2(a) is a schematic block diagram of the presently preferred form of the signal sampling circuit.
Figure 2B:
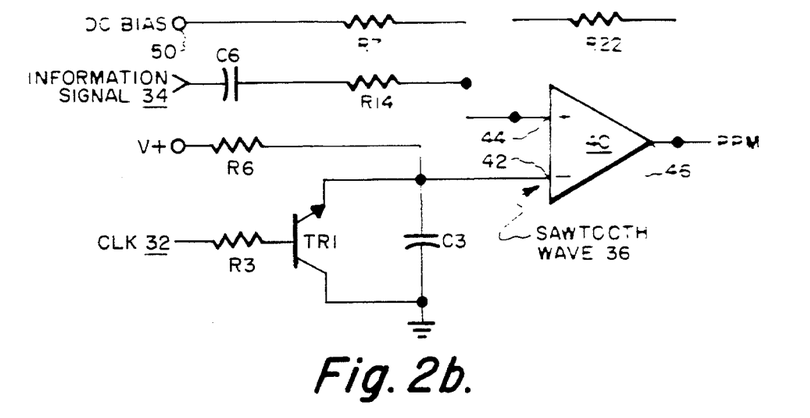
FIG. 2(b) is a schematic circuit diagram of the presently preferred form of the signal sampling circuit.
Figure 3:
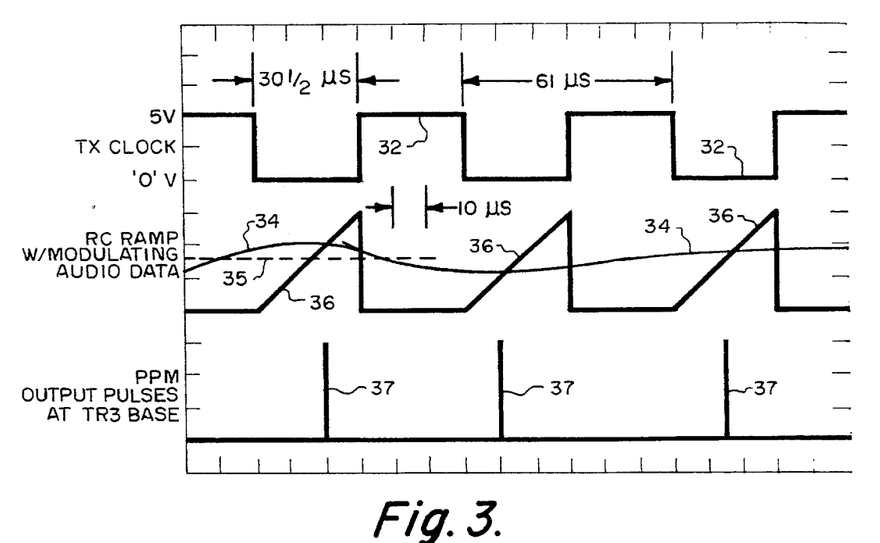
FIG. 3 illustrates voltage waveforms and time relationships in the sampling circuit of FIG. 2 in producing pulse position modulation output pulses in response to the information signal.

THE SIGNAL MODULATION CIRCUITRY (FIGS. 2 & 3)

FIG. 2(a) is a schematic block diagram of the presently preferred form of the signal sampling circuit while FIG. 2(b) is a schematic diagram of its presently preferred circuitry. FIG. 3 illustrates voltage waveforms occurring in the sampling circuit of FIG. 2(b) in sampling an input information signal to produce position modulation (PPM) output pulses.

As shown in FIG. 3 the clock pulse waveform is designated as 32. The clock signal 32, FIGS. 2(b) and 3, is an essentially square-wave periodic reference signal. It is applied through a first resistor R3 to the base of a transistor TR1, whose collector is grounded while its emitter is connected to the input terminal 42 of the comparator. A positive voltage V+ is applied through a second resistor R6 to the emitter of transistor TR1. A capacitor C3 is connected between emitter and collector of TR1.

The operation is such that in response to the low level output of the clock signal, the cooperative action of second resistor R6 and capacitor C3 produces a sawtooth voltage ramp 36 that is applied to the inverting input terminal 42 of comparator 40. The values of the circuit constants are such that the low output of the clock signal ends at no more than about 10% of the R-C charging curve, thus ensuring a linear ramp. When the clock output level rises to +5 volts, the transistor TR1 turns on hard and the charge on capacitor C3 is shorted through TR1, thus ensuring that the voltage applied to the inverting input 42 is reliably at zero. The next voltage ramp starts only in response to the next occurrence of the low level output of the clock signal, which turns off TR1. Thus, TR1 acts as an on/off switch. As shown in FIG. 3, the sawtooth wave generator is operated by the clock circuit and is responsive to each periodic occurrence of the reference signal for generating a sawtooth ramp wave having a resting cycle whose duration is approximately as great as the sawtooth ramp itself.

A comparator 40 has a first or inverting input 42 to which a sawtooth reference signal 36 is supplied. A direct voltage bias is added to the message or information signal 34 to produce a composite signal. This composite signal is applied through a capacitor C6 and resistor R14 to the positive or non-inverting input terminal 44 of the comparator. A D. C. bias is also applied from a source 50 through a resistor R7 to the non-inverting input terminal 44. A positive feedback resistor R22 is also connected from the comparator output terminal 46 back to the input terminal 44, to speed up the transition through the active input region, which results in a faster comparator fall time.

Upon coincidence of the sawtooth voltage ramp 36 and the composite waveform; i.e., when their voltage difference equals zero, negative PPM output pulses are produced at the single output terminal 46 of the comparator. A transistor inverter, not specifically shown in the drawings, is then used after the comparator output, to produce positive PPM output pulses. These PPM pulses are initially several microseconds in time duration. After the pulses are applied through capacitor C9 to the base of transistor TR3, as shown in FIG. 4(b), they are differentiated and become pulses 37 having a duration far less than a microsecond, such as 20 nanoseconds.

In the circuit of FIG. 2(b) the preferred circuit values are: the comparator is an LM339; C3 has a value of 1.1 nanofarad; resistor R6 has a value of 512 k ohms; and transistor TR1 is an N-P-N transistor such as a type 2N2222. The voltage source V+ is preferably 5 volts; D. C. bias source 50 is about +200 millivolts; the value of R7 is 10 k ohms; and the value of R14 is 330 k ohms. R3 is 15 k ohms. Capacitor C6 is 0.1 microfarad. The value of the feedback resistor R22 is 10 megohms.

As shown in FIG. 3, the action of the comparator circuit is then such that output pulses 37 are of very short but essentially constant duration, but each being varied in time relative to the associated clock reference signal by an amount proportional to the then existing amplitude of the information signal.

An alternate arrangement of the circuit of FIG. 2(b) would reverse the collector and emitter connections of TR1.

Figure 4A:
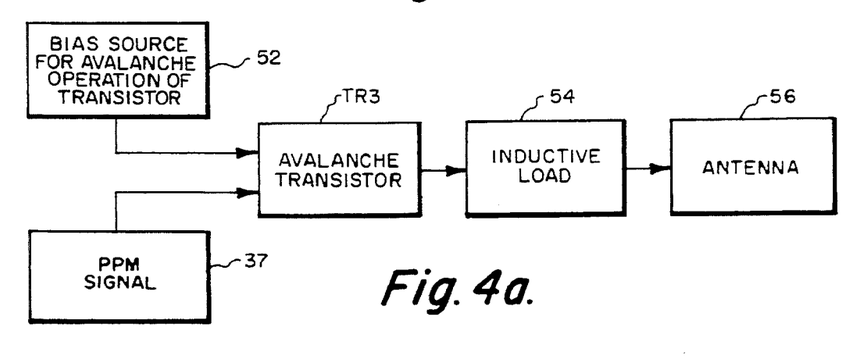
FIG. 4(a) is a schematic block diagram of the presently preferred form of the transmitter driver circuit and transmitter.
Figure 4B:
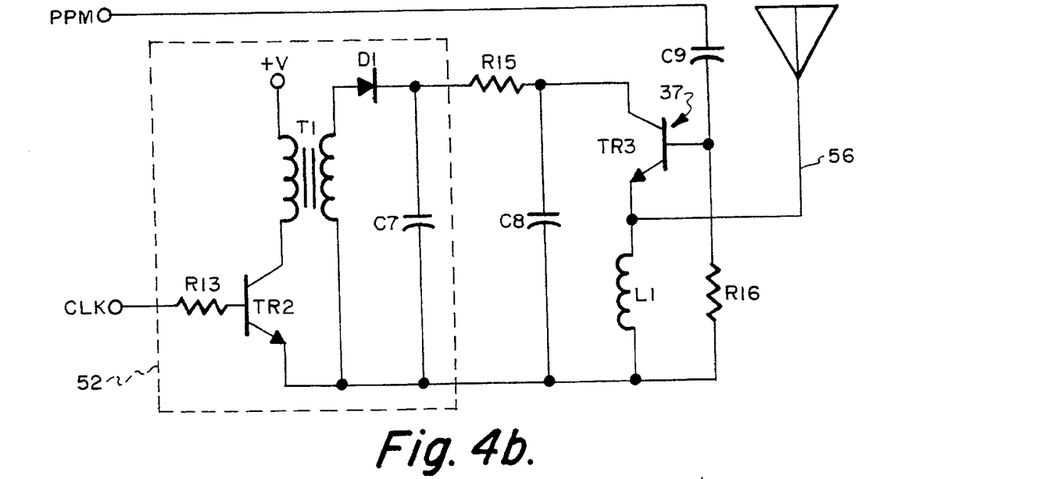
FIG. 4(b) is a schematic circuit diagram of the presently preferred form of the transmitter driver and transmitter.
Figure 4C:
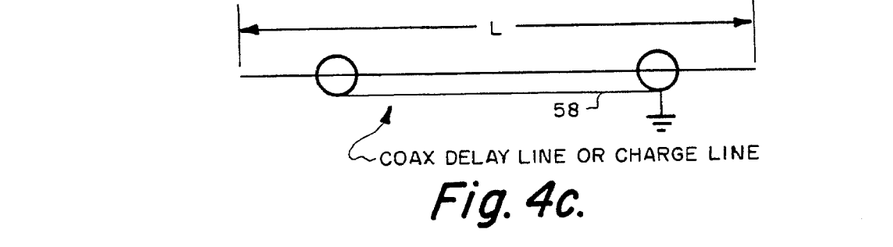
FIG. 4(c) is a schematic drawing of a delay line preferably used as the charging capacitor in the transmitter driver.
Figure 5A:
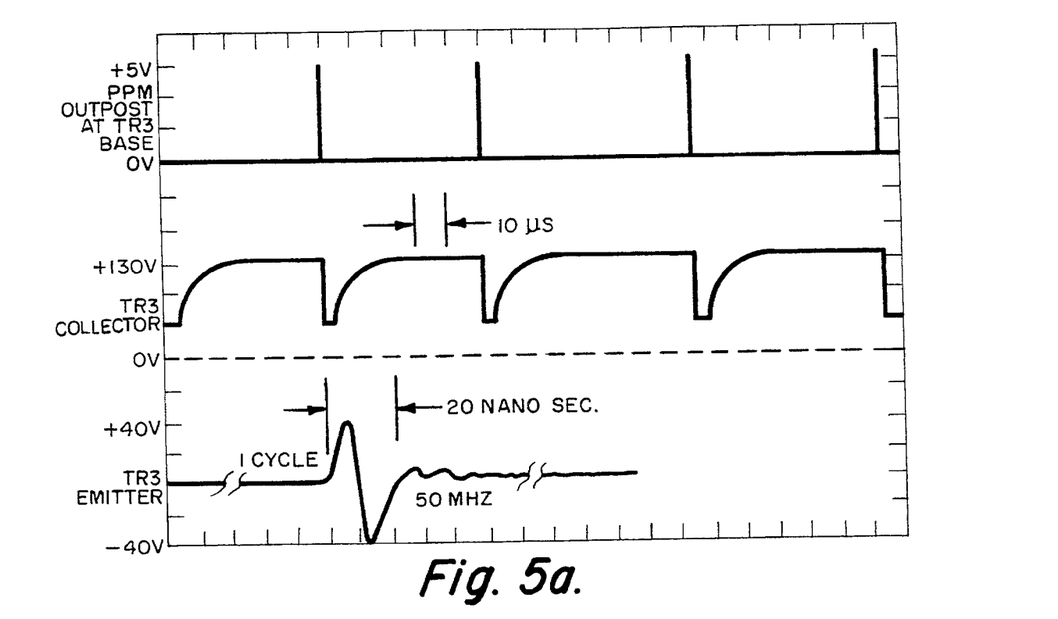
FIG. 5(a) illustrates voltage waveforms occurring in the transmitter driver and transmitter circuits of FIG. 4.
Figure 5B:
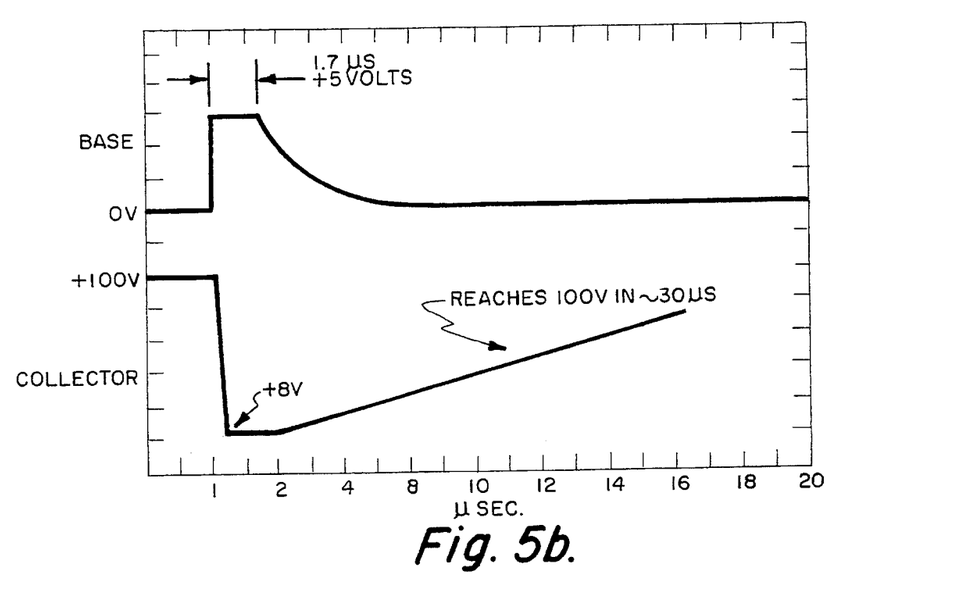
FIG. 5(b) shows the time relationships for the base and collector voltage waveforms in the driver circuit of FIG. 4(b)
Figure 5C:
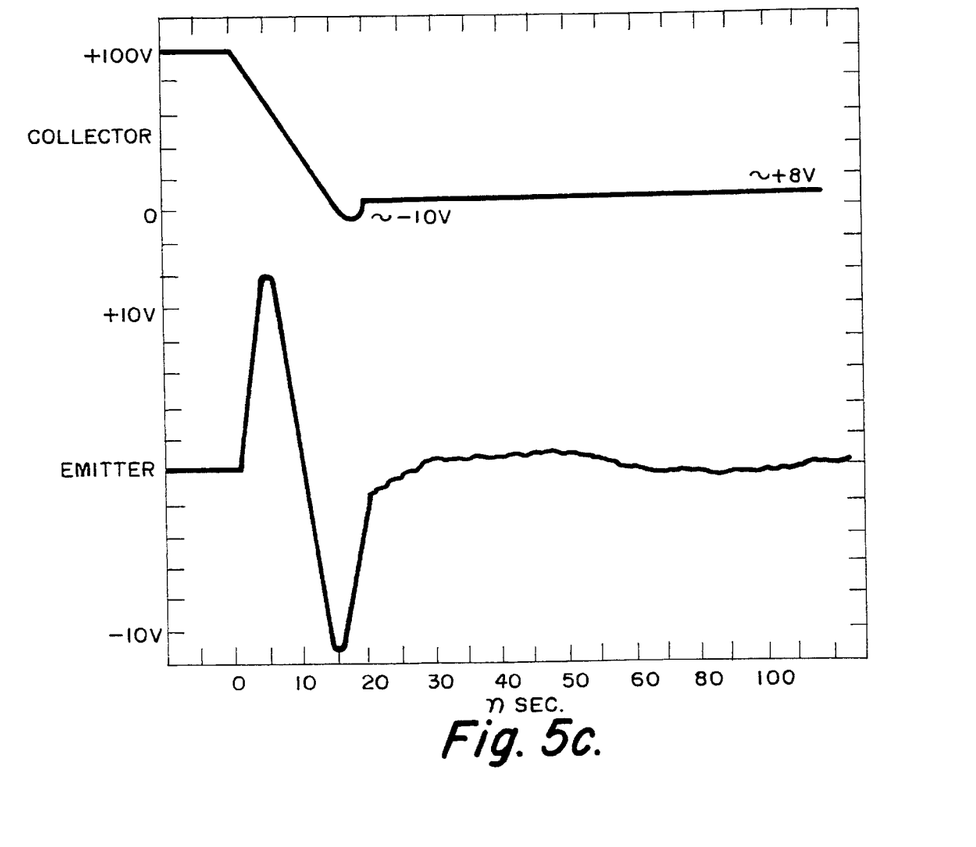
FIG. 5(c) shows, on a greatly expanded time scale, the time relationships for the collector and emitter voltage waveforms in the driver circuit of FIG. 4(b)

THE DRIVER AND TRANSMITTER CIRCUITRY (FIGS. 4 and 5)

FIGS. 4(a) and 4(b) illustrate the presently preferred form of the transmitter driver and transmitter circuit, i.e., an electrical circuit for generating intermittent high frequency pulses of extremely brief duration. A critical part of the driver circuit is a transistor TR3 that is operated in the avalanche mode. As shown in FIG. 4(a), a bias source 52 is provided for biasing the transistor for operation in the avalanche mode. The PPM signal 37 is also applied to the transistor, which drives an inductive load 54 that is coupled to an antenna 56.

As shown in FIG. 4(b), the bias source 52 is provided by a transformer T1 that has its primary winding fed from the clock circuit through a resistor R13 and transistor TR2 to provide an alternating voltage to a diode D1 that, in turn, maintains a fixed bias in the range of about +100 to +130 volts across a capacitor C7. This bias voltage is then available to bias the collector-emitter path of the avalanche transistor TR3 near its avalanche breakdown voltage.

The bias voltage of about +100 to +130 volts is also applied through a large resistor R15 across a charging capacitor C8, which is in a position to dump a large charge through the avalanche transistor whenever the proper bias conditions exist. An inductor L1 comprising the inductive load 54 is connected between the emitter of TR3 and ground. The collector of TR3, the charging capacitor C8, inductor L1, and the emitter of TR3, are connected in a series loop circuit. Thus the charging capacitor C8 is coupled between the inductor and the collector of transistor TR3 to form a series loop circuit with the emitter-collector conduction path of the transistor.

The bias source 52 and resistor R15 also provide a charging circuit for supplying a charge to capacitor C8 so that the capacitor will hold a charge ready to be discharged through the avalanche transistor. The charging resistor R15 is connected between the bias voltage source 52 and the collector of transistor TR3, for biasing the transistor near its avalanche breakdown voltage as well as supplying a charge to the charging capacitor C8 that may be discharged through said avalanche transistor.

A bias resistor R16 is connected between the base of TR3 and ground. Alternatively, this bias resistor may be connected between the base of said transistor and its emitter, at the other end of the inductor L1.

The PPM pulses after being applied through a coupling capacitor C9 to the base of transistor TR3 provide intermittent triggering pulses 37 to the transistor base to produce an avalanche of current from the charging capacitor C8 through the transistor in response to each triggering pulse.

It is important that the charging circuit is also adapted to re-charge the charging capacitor C8 at a sufficiently slow rate so that the total avalanche current discharged through the transistor is essentially limited to the charge previously stored on the charging capacitor. The capacity of the charging capacitor, the maximum voltage applied to the charging capacitor, and the time interval between successive triggering pulses, are such as to avoid destruction of said transistor.

In the biasing voltage circuit of FIG. 4(b) the preferred circuit values are as follows. R13 has the value 4.7 k ohms. Transistor TR2 is of type 2N2222. Diode D1 is type 1N3070. Capacitor C7 has the value of 0.1 microfarad.

For the operative portion of the circuit of FIG. 4(b) the preferred circuit values include a type 2N2222 transistor as TR3; capacity of 68 picofarads for capacitor C8; resistance of 100 k ohms for resistor R15; and a value of one-half micro-henries for the inductor L1. Coupling capacitor C9 is 10 picofarads and the transistor biasing resistor R16 is 4.7 k ohms.

FIG. 4(c) is a schematic drawing of a delay line 58 operating as a charge storage device and preferably used as the charging capacitor C8 in the transmitter driver.

When an output PPM pulse is applied to the base of transistor TR3, the transistor immediately conducts in avalanche fashion, producing a large current flow. The result is that a large pulse of energy is applied to the inductor circuit.

FIG. 5(a) illustrates waveforms occurring in the transmitter driver and transmitter in response to the positive PPM output pulses. The PPM voltage pulses 37 at the base of TR3, and the collector voltage, are separately shown in their relative time relationships. As there shown, voltage pulses received through coupling capacitor C9 and reaching the transistor base have a maximum positive amplitude of about 5 volts and a time duration of about 20 nanoseconds. The collector voltage drops abruptly from +130 volts to near zero volts, remaining at that level for a similar time period. In FIG. 5(a) the voltage on the emitter of TR3, however, is shown on a different and greatly enlarged time scale.

FIG. 5(b), on a greatly expanded microsecond time scale, shows in much more detail the time relationships for the base and collector voltage waveforms in the driver circuit of FIG. 4(b). FIG. 5(c) shows the time relationships for the collector and emitter voltage waveforms on an even further expanded nanosecond time scale. The waveforms of FIGS. 5(b) and 5(c) were taken from actual oscilloscope measurements on the circuitry of the preferred embodiment.

Thus as shown in FIG. 5(b), the base voltage changes from zero to +5 volts for about twenty nanoseconds. The collector voltage drops abruptly from its maximum value of +100 or +130 to about +8 volts, remaining at that level for the balance of a two-microsecond period before returning back to its normal voltage in a rising path that requires about 30 microseconds.

As further shown in FIG. 5(c), the collector in less than 20 nanoseconds drops from its normal positive voltage to about −10 volts, then returns to the +8 volt level, remaining essentially at that value for many nanoseconds before rising very much, although it does eventually rise back to its original voltage. During that same period of time the emitter makes a sharp voltage pulse from a normal zero potential to about +12 volts, then to about −12 volts, essentially completing a full and nearly perfect sine wave within twenty nanoseconds. At the end of the 20 nanoseconds there is some limited oscillation of the voltage about the zero reference line.

In general, there is thus disclosed an electrical circuit for generating intermittent high frequency pulses of extremely brief duration. The transistor having a base, a collector, and an emitter, has a resistance R in a forward conduction path from its collector through one of its base and emitter. The inductor has an inductance value L. The inductor is connected in series with the forward conduction path of the transistor. Voltage means are provided for placing the forward conduction path of the transistor near its breakdown condition. Triggering means is also provided for actuating the transistor so that its forward conduction path breaks down at least momentarily and conducts in the avalanche mode. Circuit means associated with the voltage means is also provided for supplying a large current to the forward conduction path of the transistor during its breakdown mode, whereby the inductor produces essentially a single sine wave cycle of voltage representing an oscillation frequency determined essentially by the ratio of L to R. In the particular embodiment here described the forward conduction path of the transistor is the collector-emitter path. It is also possible, by appropriate rearrangement of the circuit, to utilize instead the collector-base forward conduction path of the transistor.

Figure 6:
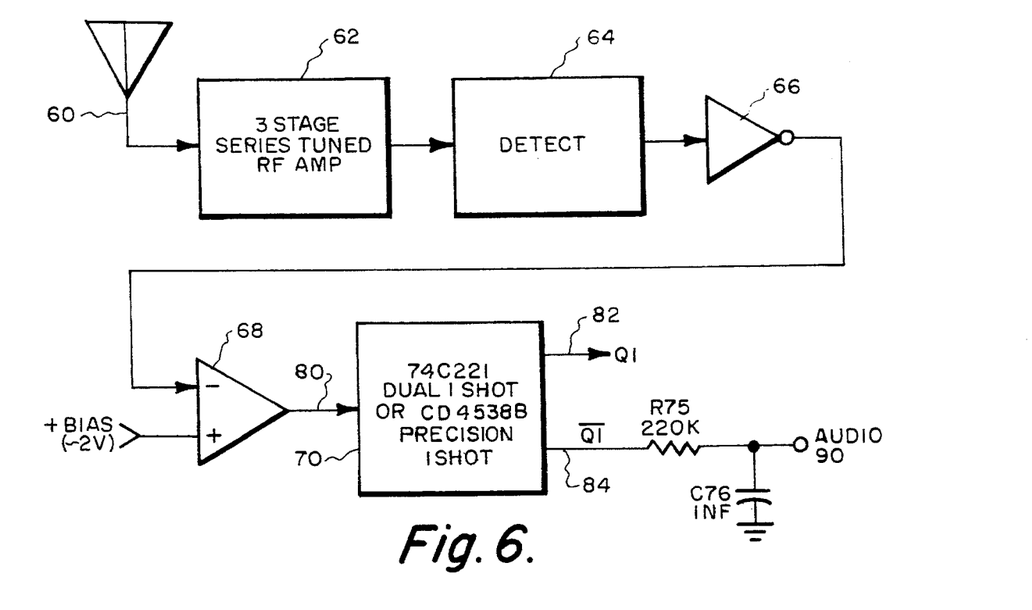
FIG. 6 is a schematic block diagram of the presently preferred form of the receiving and demodulation system of FIG. 1.
Figure 7:
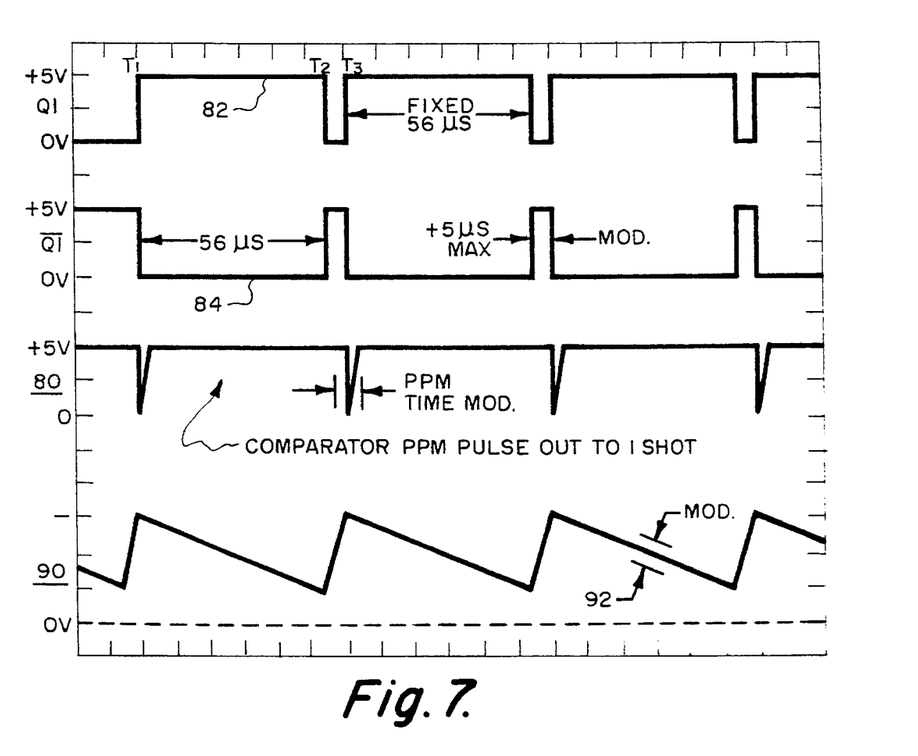
FIG. 7 shows the various voltage waveforms existing in the receiving and demodulation circuits.

RECEIVER AND DECODING CIRCUITRY (FIGS. 6 & 7)

Reference is now made to FIG. 6 showing the presently preferred form of the receiving and decoding or demodulation system of FIG. 1 in a schematic block diagram form, and FIG. 7 showing the various voltage waveforms existing in the receiving and demodulation circuits.

It will be understood that the receiver is to receive and demodulate information signals transmitted with pulse position modulation such that the pulses have a normal unmodulated separation in time but form a pulse series in which the time separation of the pulses varies in accordance with the information being transmitted.

As shown in FIG. 6, signals received by an antenna 60 are fed to an amplifier 62, which is a three-stage series-tuned amplifier. The output of amplifier 62 flows to a detector 64 which is a basic active transistor detector with a negative output pulse about a half microsecond in width. The detector output is supplied to an inverting amplifier 66, which is preferably a simple one-stage transistor amplifier with an amplification factor of about 50. Thus a means for detecting the received pulses is provided by the detector 64.

A comparator 68 is preferably of type LM339, with the usual positive and negative inputs and a single output. A positive D. C. bias is applied to the positive or non-inverting input terminal, of such magnitude as to bias the comparator operation about 100 millivolts above the no signal rest potential of the negative input. This may typically require a positive bias of about 2 volts.

The detected and amplified incoming pulses received from amplifier 66 are then applied to the negative or inverting input terminal of the comparator 68. When the comparator is triggered in response to one of the incoming pulses, it produces a waveform 80 consisting of negative output pulses with a magnitude of about 5 volts. The waveform 80 for the PPM pulses that are output from the comparator 68 is shown as the third voltage waveform in FIG. 7. These negative output pulses then trigger a one-shot multivibrator 70, which has an input and an output $\overline{Q1}$.

The series of detected pulses are then applied to the input of the multivibrator, producing at output Q1 a series of pulses 84 at the high voltage level whose width varies in accordance with the transmitted information. Pulse width modulated pulses are referred to as PWM pulses. Thus, the multivibrator converts PPM modulation to PWM modulation. The multivibrator 70 also has a complementary output Q1 which produces pulses 82.

The output $\overline{Q1}$ of the multivibrator produces an output which is at a low voltage level for a fixed period of time such as 56 microseconds that is somewhat less than the normal time separation of 61 microseconds between pulses. The multivibrator output then reverts to a high voltage level, and when triggered by the next PPM pulse switches the output voltage from the high voltage level to the low voltage level again.

In the preferred embodiment of the invention, as shown in FIG. 3, the length of the clock pulse cycle is 61 microseconds. Only one sawtooth ramp is generated in response to each repetition of the clock pulse. Thus, the nominal or unmodulated time separation between the transmitted pulses is 61 microseconds, although of course the time position of each individual pulse varies in accordance with the transmitted intelligence.

One function of the multivibrator 70 is to shut out noise or interference during most of each time when no intelligence-bearing pulse is going to be received. The multivibrator therefore has a fixed output about 56 microseconds in length during which its input will not respond to a new pulse. This allows the incoming intelligence-bearing pulses to be spaced about plus or minus 5 microseconds from their nominal or unmodulated time position and still be passed through the multivibrator.

From the multivibrator the output signal on $\overline{Q1}$ is fed to a low-pass filter circuit consisting of a resistor R75 in series and a capacitor C76 in shunt, which responds to the PWM pulses, which vary in time width, to produce waveform 90 with integrated pulse signals as shown in FIG. 7. A typical value for R75 is 220 k ohms, and for C76 is 1 nanofarad. From the low-pass filter circuit the integrated pulses 90 which are now amplitude modulated are fed to an audio circuit to recover the original information signal.

Thus the R-C low-pass circuit is coupled to the multivibrator $\overline{Q1}$ output for producing voltage waves each having a rising voltage that spans the time duration of the associated high voltage level square pulse, and whose decaying voltage amplitude is varied in accordance with the maximum voltage attained by the trailing edge of the associated high voltage level square pulse.

In FIG. 7 the first voltage waveform 82 shown is that for the Q1 output of the multivibrator 70, which is normally high but becomes negative at intermittent intervals. The second voltage waveform 84 shown in FIG. 7 is for $\overline{Q1}$, and this is simply an inverted image of the Q1 waveform. The time from the ending of each of the positive pulses 84 to the beginning of the next positive pulse is 56 microseconds, for the reasons described above. The actual duration of the positive pulses, however, varies in accordance with the received intelligence.

In FIG. 7 the third voltage waveform 80 shown is that for the negative PPM pulses that are output from the comparator 68 and which are the input to multivibrator 70.

It should be noted that another advantage of the T2 fixed time delay of the T1 time of the last PPM pulse is that it gives a much narrower PPM pulse which in effect amplifies the small PPM time delay.

The fourth waveform 90 shown in FIG. 7 is the integrated signal. Arrows 92 indicate how the time position of each declining voltage ramp may vary in accordance with the received information signal. The integrated signal 90 is fed to the audio circuit, where the original message signal is recovered.

Figure 8:
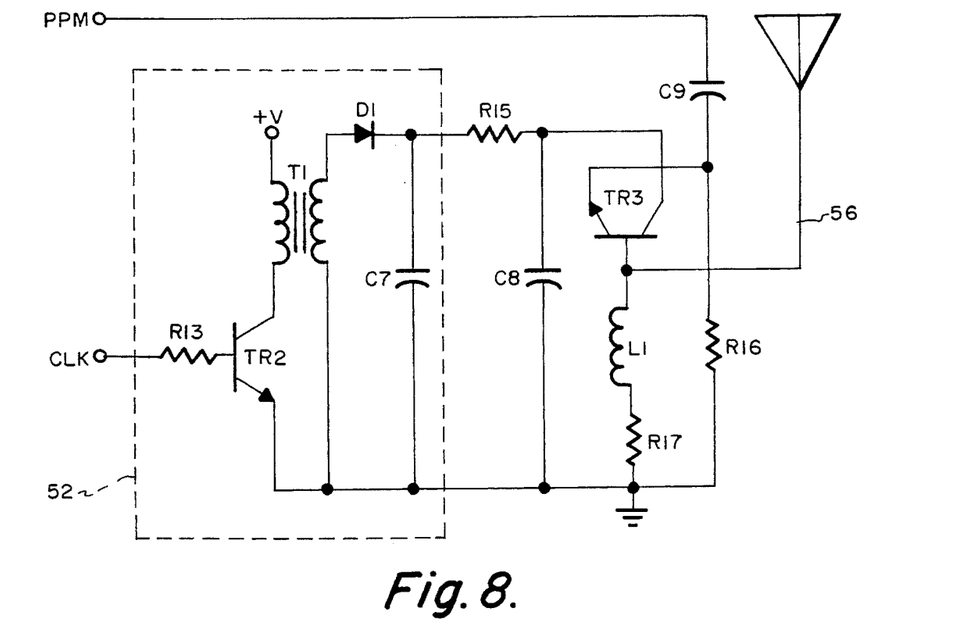
FIG. 8 is a schematic circuit diagram of an alternate form of the transmitter driver and transmitter.
Figure 9:
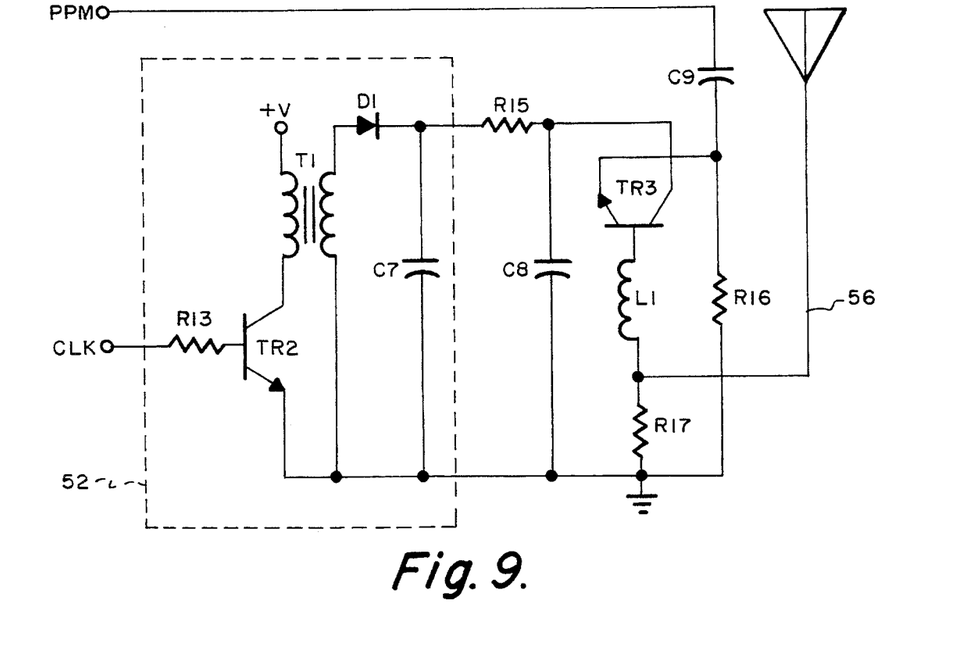
FIG. 9 is a schematic circuit diagram of another alternate form of the transmitter driver and transmitter.
Figure 10:
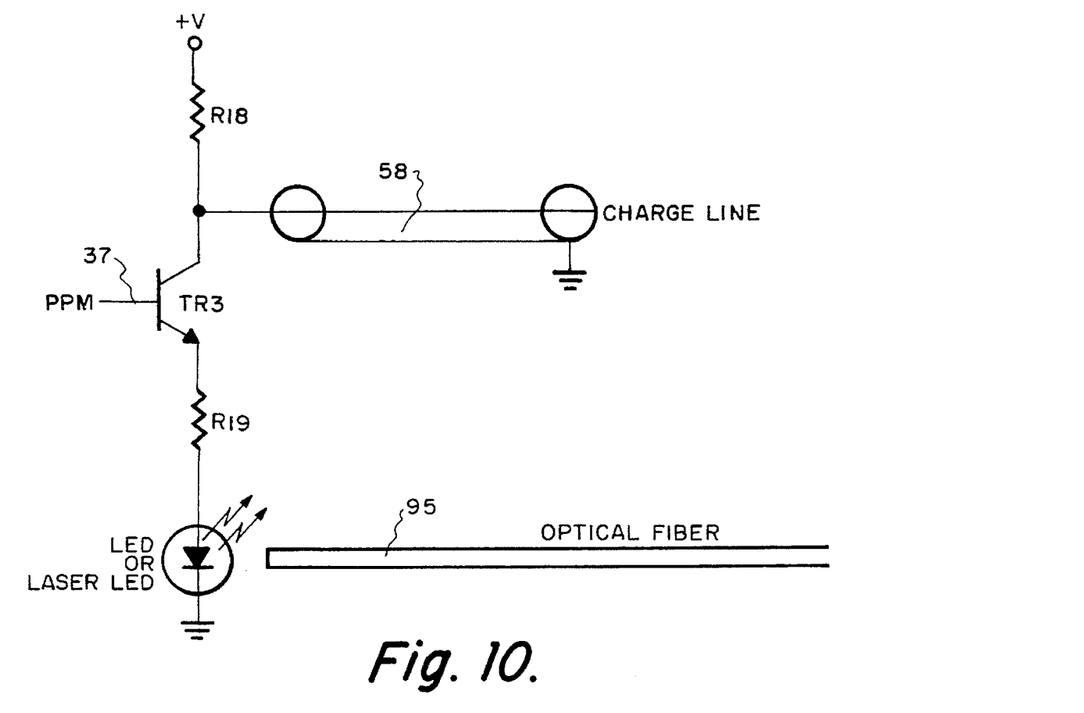
FIG. 10 is a schematic diagram of an alternate form of the invention in which a driver output is provided to an optical fiber transmission line.

ALTERNATE FORMS (FIGS. 8–10)

FIG. 8 is a schematic circuit diagram of an alternate form of the transmitter driver and transmitter, which may in fact be preferable to the circuit of FIG. 4(*b*). The voltage bias circuit 52 is the same as before. The circuit values R15, C8, TR3, L1, C9, R16, and antenna 56 are also the same as before. However, the triggering pulses are applied through C9 to the emitter of TR3; and inductor L1 and antenna 56 are connected to the base of TR3. A resistor R17 is connected in series between the other end of L1 and ground. Resistor R16 is connected between the emitter of TR3 and ground.

The function of resistor R17 can be very important. The effective frequency of the single sine wave cycle produced by the circuit is determined by the ratio of L to R, where R includes not only the resistance of the transistor during forward conductance but also the resistance value of R17. The value selected for R17 will usually be small, such as about ten ohms. A small change in the value of R17 will create a corresponding change in the period of the single cycle of the generated sine wave, which in layman's terms could be described as a change in the length or duration of the sine wave cycle and hence of its apparent frequency.

The resistor R17 may also be incorporated into the circuit of FIG. 4(*b*) for the same purpose as in FIG. 8.

FIG. 9 is a schematic circuit diagram of another alternate form of the transmitter driver and transmitter. The only change as compared to FIG. 8 is that the antenna 56 is connected to the juncture of inductor L1 and resistor R17.

FIG. 10 is a schematic diagram of an alternate form of the invention in which a driver output is provided to an optical fiber transmission line. Transistor TR3 has its collector connected through a resistor R18 to a positive voltage source +V. A delay line 58 used as a charge storage device has one of its terminals connected to the collector of TR3 while its other terminal is grounded. The emitter of TR3 is connected through a resistor R19 to the anode terminal of a light emitting diode LED, whose cathode is grounded. The PPM pulses 37 are applied to the base of TR3. An optical fiber 95 has one end exposed to the light generated by the LED.

In operation, in the circuit of FIG. 10 the voltage source +V normally holds the transistor near the breakdown condition for its collector-emitter forward conduction path. Charge line 58 is fully charged by current from +V. As each intermittent triggering pulse 37 is applied to the base of TR3, the transistor temporarily breaks down, and an avalanche of current flows from charge line 58 through the transistor. A voltage pulse applied through R19 to the LED causes a fluctuation in light emitted from it, which in turn is transmitted down the length of the optical fiber 95.

After each pulse generated by the circuit of FIG. 10, the charge line 58 is then recharged. As in the preferred embodiment of FIGS. 4 and 5, the resistance of resistor R18 is such as to prevent too rapid recharging, so that the transistor will not be destroyed by overly frequent energy pulses.

Figure 11:
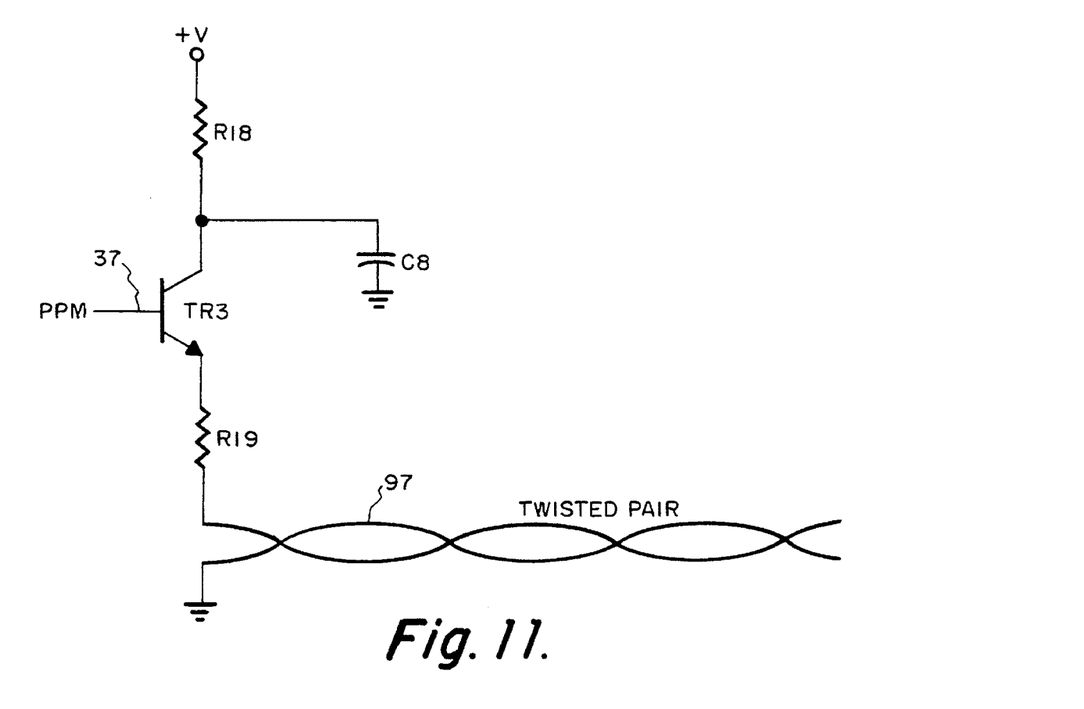
FIG. 11 is a schematic diagram of an alternate form of the invention in which a driver output is provided to a twisted pair transmission line.

FIG. 11 is a schematic diagram of an alternate form of the invention in which a driver output is provided to a twisted pair transmission line. Transistor TR3 has its collector connected through a resistor R18 to a positive voltage source +V. A capacitor 58 such as a delay line has one of its terminals connected to the collector of TR3 while its other terminal is grounded. The emitter of TR3 is connected through a resistor R19 to one lead of a twisted pair transmission line 97, whose other lead is grounded. The PPM pulses 37 are applied to the base of TR3.

In operation, in the circuit of FIG. 11 the voltage source +V normally holds the transistor near the breakdown condition for its collector-emitter forward conduction path. Capacitor C8 is fully charged by current from +V. As each intermittent triggering pulse 37 is applied to the base of TR3, the transistor temporarily breaks down, and an avalanche of current flows from capacitor C8 through the transistor. A voltage pulse applied through R19 to the input of the twisted pair transmission line then travels down the transmission line to a distant destination. The resistor R18 has a large value, as previously described.

While the presently preferred embodiment has been described with reference to single-channel and one-way communication, the present invention is by no means thus limited. By including a synchronizing clock circuit in the receiver it is possible to utilize the same receiver to receive messages on a plurality of channels simultaneously. In the described embodiment the duration of each pulse is only about 20 nanoseconds, equivalent to a continuous wave frequency of 100 Megahertz. Yet the time interval between unmodulated pulses sent from a single transmitter is about 60 microseconds. Thus, the receiver while receiving single channel transmission is operating less than 1/1000 of the time. Signals may be sent sequentially from multiple different signal channels. It is therefore possible to receive as many as fifty channels on a single receiver without overloading or damaging the circuitry.

When multiple channels are being received concurrently, a time multiplex system is used that will adequately distinguish among the various separate channels.

What we claim is:

1. An electrical circuit for generating intermittent high frequency pulses of extremely brief duration, comprising:

(a) a transistor having a base, emitter, and collector;

(b) an inductor connected to the emitter of said transistor;

(c) a charging capacitor coupled between said inductor and the collector of said transistor to form a series loop circuit with the emitter-collector conduction path of said transistor;

(d) a source of bias voltage;

(e) a charging resistor connected between said bias voltage source and the collector of said transistor, for biasing said transistor near its avalanche breakdown voltage as well as supplying a charge to be stored on said charging capacitor that may be discharged through said transistor;

(f) a bias resistor connected between the base of said transistor and one end of said inductor;

(g) a coupling capacitor coupled to the base of said transistor for applying intermittent triggering pulses thereto to produce an avalanche of current from said charging capacitor through said transistor in response to each said triggering pulse;

(h) said charging resistor being selected of sufficiently large value to permit the recharging of said charging capacitor at only a slow rate so that the avalanche current discharged through said transistor in response to each pulse is essentially limited to the charge previously stored on said charging capacitor; and (i) the capacity of said charging capacitor, the maximum voltage applied to said charging capacitor, and the time interval between successive triggering pulses, being such as to avoid destruction of said transistor.

2. An electrical circuit as in claim 1 wherein said transistor is of the N-P-N type.

3. An electrical circuit as in claim 1 which includes a delay line forming said charging capacitor.

4. An electrical circuit as in claim 3 wherein said delay line is a coaxial cable.

5. An electrical circuit as in claim 1 which further includes an antenna coupled in parallel with said inductor.

6. An electrical circuit for generating intermittent high frequency pulses of extremely brief duration, comprising:
(a) a transistor having a base, emitter, and collector;
(b) an inductor having one end connected to the base of said transistor;
(c) a first resistor connected between the other end of said inductor and ground;
(d) a charging capacitor coupled between ground and the collector of said transistor to form a series loop circuit with the base-collector conduction path of said transistor;
(e) a source of bias voltage;
(f) a charging resistor connected between said bias voltage source and the collector of said transistor, for biasing said transistor near its avalanche breakdown voltage as well as supplying a charge to said charging capacitor that may be discharged through said transistor;
(g) a bias resistor connected between the emitter of said transistor and the other end of said inductor;
(h) a coupling capacitor coupled to the emitter of said transistor for applying intermittent triggering pulses thereto to produce an avalanche of current from said charging capacitor through said transistor in response to each said triggering pulse;
(i) said charging resistor being selected of sufficiently large value to permit the recharging of said charging capacitor at only a slow rate so that the avalanche current discharged through said transistor in response to each pulse is essentially limited to the charge previously stored on said charging capacitor; and
(j) the capacity of said charging capacitor, the maximum voltage applied to said charging capacitor, and the time interval between successive triggering pulses, being such as to avoid destruction of said transistor.

7. An electrical circuit as in claim 6 wherein said transistor is of the N-P-N type.

8. An electrical circuit as in claim 6 which includes a delay line forming said charging capacitor.

9. An electrical circuit as in claim 8 wherein said delay line is a coaxial cable.

10. An electrical circuit as in claim 6 which further includes an antenna coupled in parallel with said inductor.

11. An electrical circuit for producing short, widely separated, high frequency pulses, comprising:
(a) a transistor having a base, a collector, and an emitter, and having a forward conduction path extending from its collector to one of said base and emitter;
(b) an inductor;
(c) a delay line connected in a series loop circuit with said inductor and with said forward conduction path of said transistor;
(d) circuit means for charging said delay line and holding said forward conduction path of said transistor near its breakdown condition; and
(e) means for intermittently triggering said transistor into its breakdown condition,
so that an avalanche of current then flows from said delay line through said forward conduction path into said inductor, and there appears across said inductor essentially a single sine wave cycle of voltage representing an oscillation frequency that is determined essentially by inductance value of said inductor and resistance value of said forward conduction path during conduction.

12. An electrical circuit as claimed in claim 11 wherein said forward conduction path is the collector-emitter path.

13. An electrical circuit as claimed in claim 11 wherein said forward conduction path is the collector-base path.

14. An electrical circuit for generating intermittent high frequency pulses of extremely brief duration, comprising:
(a) a transistor having a base, a collector, and an emitter, and a forward conduction path from its collector through one of said base and emitter;
(b) an inductor connected in series with said forward conduction path of said transistor;
(c) voltage means for placing said forward conduction path of said transistor near its breakdown condition;
(d) triggering means for actuating said transistor so that said forward conduction path breaks down at least momentarily and conducts in the avalanche mode; and
(e) means associated with said voltage means for supplying a large current to said forward conduction path of said transistor during its breakdown mode, whereby said inductor produces essentially a single sine wave cycle of voltage representing an oscillation frequency determined essentially by the ratio of the inductance of said inductor to the resistance of said forward conduction path.

15. An electrical circuit as claimed in claim 14 wherein said forward conduction path is the collector-emitter path.

16. An electrical circuit for generating intermittent high frequency pulses of extremely brief duration, comprising:
(a) a transistor;
(b) circuit means biasing said transistor near its avalanche breakdown voltage;
(c) an inductor and a capacitor coupled in a series loop circuit with the emitter-collector conduction path of said transistor;
(d) a charging circuit for supplying a charge to said capacitor so that said capacitor will hold a charge ready to be discharged through said avalanche transistor;
(e) means for applying intermittent triggering pulses to said transistor to produce avalanche conduction therethrough in response to each said triggering pulse;
(f) said charging circuit also being adapted to re-charge said charging capacitor at a slow rate so that an avalanche current is discharged through said transistor which is essentially limited to the charge previously stored on said charging capacitor;
(g) a transmitting antenna coupled in parallel with said inductor; and
(h) the capacity of said charging capacitor, the maximum voltage applied to said charging capacitor, and the time interval between successive triggering pulses, being such as to avoid destruction of said transistor.

17. An electrical circuit as in claim 16 wherein said means for applying triggering pulses is adapted to apply said pulses to the base of said transistor.

18. An electrical circuit as in claim 16 which includes a delay line forming said charging capacitor.

19. An electrical circuit as in claim 18 wherein said delay line is a coaxial cable.

20. An electrical circuit for generating intermittent high frequency pulses of extremely brief duration and providing them to a twisted pair transmission line, comprising:

(a) a transistor having a base, a collector, and an emitter, and a forward conduction path from its collector through one of said base and emitter;

(b) a resistor and a twisted pair transmission line connected in a series loop circuit with said forward conduction path of said transistor;

(c) voltage means for placing said forward conduction path of said transistor near its breakdown condition;

(d) triggering means for actuating said transistor so that said forward conduction path breaks down at least momentarily and conducts in the avalanche mode; and (e) delay line means associated with said voltage means for supplying a large current to said forward conduction path of said transistor during its breakdown mode, whereby said resistor produces a voltage wave that is applied through said resistor to said twisted pair transmission line.

21. An electrical circuit as in claim 11 wherein said triggering means is adapted for triggering said transistor at time intervals that are many times the duration of said single sine wave of voltage.

22. An electrical circuit as in claim 11 wherein said triggering means is adapted for triggering said transistor at time intervals that are more than a thousand times the duration of said single sine wave of voltage.

23. An electrical circuit as in claim 14 wherein said triggering means is adapted for triggering said transistor at time intervals that are many times the duration of said single sine wave of voltage.

24. An electrical circuit as in claim 14 wherein said triggering means is adapted for triggering said transistor at time intervals that are more than a thousand times the duration of said single sine wave of voltage.

25. An electrical circuit as in claim 16 wherein said triggering means is adapted for triggering said transistor at time intervals that are many times the duration of said single sine wave of voltage.

26. An electrical circuit as in claim 16 wherein said triggering means is adapted for triggering said transistor at time intervals that are more than a thousand times the duration of said single sine wave of voltage.

27. An electrical circuit as in claim 20 wherein said triggering means is adapted for triggering said transistor at time intervals that are many times the duration of said single sine wave of voltage.

28. An electrical circuit as in claim 20 wherein said triggering means is adapted for triggering said transistor at time intervals that are more than a thousand times the duration of said single sine wave of voltage.

29. An electrical circuit utilizing a transistor in the avalanche mode for generating and transmitting very short and widely separated high frequency sine-wave pulses of electrical energy, comprising:

a discharge circuit including a charging capacitor and an inductor connected in a first series loop path with two electrodes of the transistor that are part of a forward conduction path;

a triggering circuit including a coupling capacitor connected to the other electrode of the transistor to provide an input for triggering it into its breakdown or avalanche mode;

antenna means coupled to said inductor for transmitting electromagnetic energy into space;

a recharging circuit including a charging resistor and a bias voltage source coupled with said charging capacitor into a second series loop path, said bias voltage source being capable of biasing the forward conduction path of the transistor near its breakdown condition; and the time constant of said recharging circuit being at least many times greater than the time constant of said discharge circuit, so that when current is being discharged from said capacitor into said inductor through said forward conduction path of said transistor the avalanche mode current carriers will recombine concurrently with or soon after the generation of the RF cycle or cycles, and then end the low resistance avalanche mode.

30. An electrical circuit as in claim 29 wherein said charging resistor is selected of sufficiently large value to permit the recharging of said charging capacitor at such a slow rate that the avalanche current discharged through said transistor in response to each pulse is essentially limited to the charge previously stored on said charging capacitor.

31. An electrical circuit as in claim 29 wherein the capacity of said charging capacitor, the maximum voltage applied to it, and the time interval between successive triggering pulses, are so selected as to avoid destruction of said transistor.

32. An electrical circuit as claimed in claim 29 wherein said transistor is of the N-P-N type having a base, a collector, and emitter, and a forward conduction path extending from its collector to one of said base and emitter; one terminal of said bias voltage source is connected to said collector; and one terminal of said charging capacitor is also connected to said collector.

33. An electrical circuit as claimed in claim 32 wherein said forward conduction path is the collector-emitter path.

34. An electrical circuit as claimed in claim 32 wherein said forward conduction path is the collector-base path.

35. The electrical circuit of claim 29 which includes a delay line forming said capacitor.

36. An electrical circuit as in claim 30 wherein said inductor produces essentially a single sine wave cycle of voltage representing an oscillation frequency determined essentially by the ratio of the inductance of said inductor to the resistance of said forward conduction path of said transistor during breakdown.

37. An electrical circuit as in claim 33 wherein said coupling capacitor is connected to the base of said transistor, and which further includes a bias resistor having one end connected to the base of said transistor, said inductor being connected between the other end of said bias resistor and the emitter of said transistor.

38. An electrical circuit as in claim 34 wherein said coupling capacitor is connected to the emitter of said transistor, said first series loop further includes a load resistor connected between said inductor and said charging capacitor, and which further includes a bias resistor connected between the emitter of said transistor and said load resistor.

39. An electrical circuit as in claim 38 wherein said antenna means is connected to the juncture between said inductor and said load resistor.

40. An electrical circuit as in claim 29 wherein said triggering circuit is adapted for triggering said transistor at time intervals that are many times the duration of said single sine wave of voltage.

41. An electrical circuit as in claim 29 wherein said triggering circuit is adapted for triggering said transistor at time intervals that are more than a thousand times the duration of said single sine wave of voltage.

42. An electrical circuit as in claim 33 wherein said triggering circuit is adapted for triggering said transistor at time intervals that are many times the duration of said single sine wave of voltage.

43. An electrical circuit as in claim 33 wherein said triggering circuit is adapted for triggering said transistor at time intervals that are more than a thousand times the duration of said single sine wave of voltage.

44. An electrical circuit as in claim 35 wherein said triggering circuit is adapted for triggering said transistor at time intervals that are many times the duration of said single sine wave of voltage.

45. An electrical circuit as in claim 45 wherein said triggering circuit is adapted for triggering said transistor at time intervals that are more than a thousand times the duration of said single sine wave of voltage.

46. An electrical circuit as in claim 37 wherein said triggering circuit is adapted for triggering said transistor at time intervals that are many times the duration of said single sine wave of voltage.

47. An electrical circuit as in claim 37 wherein said triggering circuit is adapted for triggering said transistor at time intervals that are more than a thousand times the duration of said single sine wave of voltage.

48. An electrical circuit as in claim 39 wherein said triggering circuit is adapted for triggering said transistor at time intervals that are many times the duration of said single sine wave of voltage.

49. An electrical circuit as in claim 39 wherein said triggering circuit is adapted for triggering said transistor at time intervals that are more than a thousand times the duration of said single sine wave of voltage.

50. An electrical circuit for generating and transmitting very short and widely separated high frequency sine-wave pulses of electrical energy, comprising:
   a transistor of the N-P-N type having a base, a collector, and emitter, and a forward conduction path extending from its collector to its emitter;
   a discharge circuit including a delay line and an inductor connected in a first series loop with said forward conduction path of said transistor, said inductor being connected to said emitter;
   a triggering circuit including a coupling capacitor connected to said base of said transistor to provide an input for triggering it into its breakdown or avalanche mode;
   an antenna connected in parallel with said inductor for transmitting electromagnetic energy into space;
   a recharging circuit including a charging resistor and a bias voltage source coupled with said delay line into a second series loop, said bias voltage source being capable of biasing the forward conduction path of the transistor near its breakdown condition; and
   the time constant of said recharging circuit being at least many times greater than the time constant of said discharge circuit, so that when current is being discharged from said delay line into said inductor through said forward conduction path of said transistor the avalanche mode current carriers will recombine and end the low resistance avalanche mode upon exhaustion of the charge stored in the charge line.

51. An electrical circuit as in claim 50 wherein said triggering circuit is adapted for triggering said transistor at time intervals that are many times the duration of said single sine wave of voltage.

52. An electrical circuit as in claim 50 wherein said triggering circuit is adapted for triggering said transistor at time intervals that are more than a thousand times the duration of said single sine wave of voltage.

53. An electrical circuit utilizing a transistor in the avalanche mode for generating and transmitting very short and widely separated high frequency sine-wave pulses of electrical energy, comprising:
   a discharge circuit including a charging capacitor and an inductor connected in a first series loop, with two electrodes of the transistor forming its forward conduction path;
   a triggering circuit including a coupling capacitor connected to the other electrode of the transistor to provide an input for triggering it into its breakdown or avalanche mode;
   antenna means coupled to said inductor for transmitting electromagnetic energy into space;
   a recharging circuit including a bias voltage source coupled with said charging capacitor into a second series loop, said bias voltage source being capable of biasing the forward conduction path of the transistor near its breakdown condition; and
   said recharging circuit being inoperable for recharging said charging capacitor at least until sufficient current has been discharged from said capacitor into said inductor through said forward conduction path of said transistor to cause the avalanche mode current carriers to recombine so as to end the low resistance avalanche mode.

54. An electrical circuit as in claim 53 wherein said triggering circuit is adapted for triggering said transistor at time intervals that are many times the duration of said single sine wave of voltage.

55. An electrical circuit as in claim 53 wherein said triggering circuit is adapted for triggering said transistor at time intervals that are more than a thousand times the duration of said single sine wave of voltage.

56. The method of generating and transmitting very short and widely separated high frequency sine-wave pulses of electrical energy, comprising:
   coupling a transistor, a charging capacitor, and a load device into a first series loop path forming a discharge circuit;
   coupling a bias voltage source and the same charging capacitor into a second series loop path forming a recharging circuit with a large RC time constant compared to the first series loop path, the bias voltage source being selected to be capable of biasing the forward conduction path of the transistor near its breakdown condition;
   coupling an antenna means to the load device for transmitting electromagnetic energy pulses into space;
   sampling an original information signal upon each occurrence of a periodic reference signal; and
   in response to the signal samples, triggering the transistor into its breakdown or avalanche mode so as to create a series of successive transmitted pulses whose starting times are modified in accordance with the value of the original information signal upon each occurrence of the periodic reference signal.

57. The method of claim 56 wherein the time period of the periodic reference signal is at least many times the length of each transmitted pulse.

* * * * *